(12) United States Patent
Bautista, Jr. et al.

(10) Patent No.: US 12,165,942 B2
(45) Date of Patent: Dec. 10, 2024

(54) INTEGRATED CIRCUIT PACKAGES WITH CAVITIES AND METHODS OF MANUFACTURING THE SAME

(71) Applicant: Texas Instruments Incorporated, Dallas, TX (US)

(72) Inventors: Jesus Bajo Bautista, Jr., Baguio (PH); Jeffrey Dorado Emperador, Baguio (PH); Francis Masiglat de Vera, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/586,680

(22) Filed: Jan. 27, 2022

(65) Prior Publication Data

US 2022/0157678 A1    May 19, 2022

Related U.S. Application Data

(63) Continuation of application No. 15/858,986, filed on Dec. 29, 2017, now abandoned.

(51) Int. Cl.
*H01L 23/31* (2006.01)
*H01L 21/48* (2006.01)
(Continued)

(52) U.S. Cl.
CPC ........ *H01L 23/315* (2013.01); *H01L 21/4825* (2013.01); *H01L 21/565* (2013.01); *H01L 23/3121* (2013.01); *H01L 23/4951* (2013.01); *H01L 23/49575* (2013.01); *H01L 23/49586* (2013.01); *H01L 23/49827* (2013.01); *H01L 23/49861* (2013.01); *H01L 24/49* (2013.01); *H01L 24/73* (2013.01); *H01L 2224/32145* (2013.01); *H01L 2224/32225* (2013.01); *H01L 2224/48091* (2013.01); *H01L 2224/73265* (2013.01); *H01L 2924/00014* (2013.01)

(58) Field of Classification Search
CPC ................. H01L 41/113; H01L 41/125; H01L 2224/7592; H01L 2224/75925; H01L 23/315; H01L 24/73; H01L 21/4825; H01L 23/49586; H01L 23/49827; H01L 23/4951; H01L 23/3121; H01L 23/49861; H01L 24/49; H01L 2224/32225
USPC ........................................................ 257/732
See application file for complete search history.

(56) References Cited

U.S. PATENT DOCUMENTS 4,012,766 A    3/1977  Phillips et al.
4,663,833 A    5/1987  Tanaka et al.
(Continued)

OTHER PUBLICATIONS

Henkel, "Technomelt AS 8998 precise peelable mask," [technomelt-simply3.com], 2017, 2 pages.

*Primary Examiner* — Mohammad M Hoque
(74) *Attorney, Agent, or Firm* — Dawn Jos; Frank D. Cimino (57) ABSTRACT

Integrated circuit packaging with cavities and methods of manufacturing the same are disclosed. An example apparatus includes a semiconductor die and a housing enclosing portions of the semiconductor die. The housing defines an opening that extends from a surface of the semiconductor die to an external environment, the housing formed of a first material. The example apparatus includes a second material disposed within the opening to block exposure of the semiconductor die to the external environment.

16 Claims, 6 Drawing Sheets

(51) Int. Cl.
*H01L 21/56* (2006.01)
*H01L 23/00* (2006.01)
*H01L 23/495* (2006.01)
*H01L 23/498* (2006.01)

(56) References Cited

U.S. PATENT DOCUMENTS

| | | |
|---|---|---|
| 6,316,840 B1 | 11/2001 | Otani |
| 6,441,503 B1 | 8/2002 | Webster |
| 8,766,186 B2 | 7/2014 | Kierse et al. |
| 8,778,738 B1 | 7/2014 | Lin et al. |
| 9,214,402 B2 | 12/2015 | Fam et al. |
| 2002/0031672 A1 | 3/2002 | Eguchi et al. |
| 2005/0224953 A1 | 10/2005 | Lee et al. |
| 2005/0269591 A1 | 12/2005 | Hsin |
| 2006/0027026 A1 | 2/2006 | Aoyama et al. |
| 2007/0069354 A1 | 3/2007 | Dangelmaier et al. |
| 2007/0090473 A1 | 4/2007 | Engling et al. |
| 2007/0164420 A1 | 7/2007 | Chen et al. |
| 2008/0157301 A1 | 7/2008 | Ramakrishna et al. |
| 2008/0197365 A1 | 8/2008 | Shen |
| 2009/0134481 A1* | 5/2009 | Sengupta ............ H01L 24/97 257/E31.117 |
| 2010/0019368 A1 | 1/2010 | Shin |
| 2010/0025699 A1 | 2/2010 | Liu et al. |
| 2010/0148211 A1 | 6/2010 | Sheu et al. |
| 2010/0164082 A1* | 7/2010 | Fujisawa ............ H01L 21/568 257/434 |
| 2010/0164346 A1 | 7/2010 | Li et al. |
| 2010/0201254 A1 | 8/2010 | Matsumura |
| 2010/0227454 A1 | 9/2010 | Dohmae |
| 2011/0024899 A1 | 2/2011 | Masumoto et al. |
| 2013/0221470 A1* | 8/2013 | Kinsman ........... H01L 27/14618 257/434 |
| 2013/0240922 A1 | 9/2013 | Yamamoto |
| 2014/0340302 A1 | 11/2014 | Sengupta et al. |
| 2014/0374848 A1 | 12/2014 | Koh et al. |
| 2015/0048394 A1* | 2/2015 | Shim ................. H01L 25/0756 257/89 |
| 2015/0069537 A1 | 3/2015 | Lo et al. |
| 2015/0090041 A1 | 4/2015 | Imai |
| 2015/0137279 A1 | 5/2015 | Tiu et al. |
| 2015/0160087 A1* | 6/2015 | Foong .................... H01L 24/09 73/146.2 |
| 2016/0084722 A1 | 3/2016 | Hooper et al. |
| 2016/0141440 A1* | 5/2016 | Chun ..................... H01L 31/18 257/82 |
| 2016/0376056 A1 | 12/2016 | Wen |
| 2017/0345949 A1 | 11/2017 | Tomita |
| 2017/0363492 A1 | 12/2017 | Chen et al. |

* cited by examiner

INTEGRATED CIRCUIT PACKAGES WITH CAVITIES AND METHODS OF MANUFACTURING THE SAME

This application is a continuation of U.S. application Ser. No. 15/858,986, filed Dec. 29, 2017, the contents of all of which are herein incorporated by reference in its entirety.

FIELD OF THE DISCLOSURE

This disclosure relates generally to integrated circuit packages, and, more particularly, to integrated circuit packages with cavities and methods of manufacturing the same.

BACKGROUND

Integrated circuit (IC) packaging involves the encapsulation or sealing of semiconductor devices within a housing that includes electrical contacts to connect the devices with other electrical components. A common type of material used for the housing of an IC package is molded epoxy resin. However, in certain applications different types of materials may be employed for the housing so as not to degrade or otherwise affect the functionality of the semiconductor devices the materials are intended to encase.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer) is in any way positioned on (e.g., disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

A common technique to integrate multiple semiconductor dies into a single IC package involves the vertical stacking of dies. Typically, the vertical integration of dies in this manner occurs before the stacked assembly of dies is encapsulated. In such situations, each of the dies in the vertical stack are encapsulated by the same material. As a result, each of the dies in the stack are subject to the same conditions arising from the material properties of the encapsulating material. This can be problematic when the functionality of the different dies benefits from different encapsulating material.

For example, epoxy resins used as the encapsulating material for many IC packages have a relatively high modulus of elasticity that does not provide sufficient relief for dies with relatively low resistance to stress related electrical failures. Such dies are referred to herein as stress-sensitive semiconductor devices. Stress-sensitive semiconductor devices include circuit designs and/or features with functions that may not operate or operate with less accuracy when subject to relatively high mechanical or thermomechanical stresses. Example stress-sensitive semiconductor devices include bulk acoustic wave resonators, stress sensors, high precision ICs, etc. Such devices encased within a package formed of a material with a relatively high modulus of elasticity may result in a degradation of performance in their function to the point where they no longer meet design specifications. However, using a material with a lower modulus of elasticity for the housing of the IC package may not provide sufficient rigidity to protect against other forms of mechanical failure of different dies vertically integrated with one or more stress-sensitive semiconductor devices.

One solution to the above challenge is to avoid the vertical stacking of dies. By keeping the dies separate, they can be separately encapsulated with a different material so as not to undermine or deleteriously impact the corresponding functionality of each die. However, this results in packaging with much larger formfactors or footprints than when the dies are stacked. An alternative solution is to stack the stress-sensitive semiconductor device(s) on top of other dies, apply a low modulus material directly around the stress-sensitive semiconductor device(s), and then encapsulate the entire assembly using a more rigid molding compound for the outer housing in a manner that maintains a gap between the low modulus material and the outer molding compound. The gap enables the low modulus material to flex or move as it absorbs stresses experienced by the IC package so as to protect the die encased therein. The problem with such packaging techniques is that there is no way to guarantee that a gap is maintained between the low modulus material and the outer housing. If a gap is not maintained between the low modulus material and the outer housing, there is a risk that the low modulus material will adhere to the outer housing. If the low modulus material adheres to the outer housing, the intended benefits of the low modulus material may be compromised because the low modulus material will no longer be able to absorb stresses by its free movement relative to the outer housing. A third alternative solution is to encapsulate the vertically integrated dies using hermetic packaging techniques in which no material is directly applied to the stress-sensitive dies. However, hermetic packaging is relatively expensive and, thus, may be cost prohibitive. Furthermore, because the dies in hermetic packaging are not directly covered by any material, there is an increased likelihood that the wire bonds interconnecting the dies will short circuit when the IC package is subsequently used. Thus, hermetic packaging solutions are also limited to relatively simple designs of vertically integrated dies.

Examples disclosed herein overcome the above challenges by enabling the separate encapsulation (using different materials) of vertically stacked dies. More particularly, an example IC package may include a first die, that is not stress-sensitive, encapsulated within a housing made of a first material having a relatively high modulus of elasticity (e.g., greater than 200 MPa). The example IC package further includes a second die that is stress-sensitive and mounted on a surface of the first die and encapsulated with a second material having a relatively low modulus of elasticity (e.g., less than 200 MPa). The second material is open or exposed to an external environment of the IC package to provide the second material with space to move and/or deform without risk of being confined by the first material or any other housing. This ability to move enables the second material to absorb stresses experienced by the IC package to properly protect the stress-sensitive semiconductor device of the second die. As described more fully herein, the separate encapsulation of the two dies is accomplished by encapsulating the first die before the second die is mounted (stacked) onto the first die. In some examples, the housing encapsulating the underlying first die is formed with a cavity or opening to expose at least a portion of the underlying die to enable access for mounting the second die. Subsequently, the cavity is filled with the second material (having a relatively low modulus of elasticity) to encapsulate the second die and cover the exposed portion of the underlying die.

A similar approach may be used to encapsulate other types of dies that need different types of encapsulating materials to function properly. For instances, in some examples, the second die may include an optical semiconductor device. Example optical semiconductor devices include photosensors, light emitting diodes (LEDs), etc. For optical semiconductor devices, the encapsulant needs to be transparent or translucent to allow light to pass between the encapsulated device and the surrounding environment. Materials typically used for such purposes (such as certain silicone based encapsulants) may result in excessive stress on the underlying first die, thereby preventing its proper operation if the integrated stack of dies is encapsulated by such a material. However, encapsulating the first die, as disclosed herein, within a housing formed of a first material and then mounting the second (optical) die onto the first die within a cavity of the housing into which a second material is subsequently applied to cover the second die, enables the appropriate selection of the first and second materials that avoid excessive stresses in the first die while enabling light to be transmitted through the second material for the second die.

Figure 1:
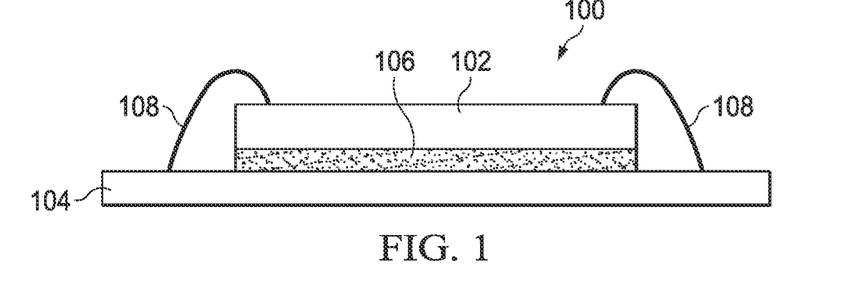
FIGS. 1-4 illustrate example stages in the formation of an example IC package constructed in accordance with the teachings disclosed herein.
Figure 2:
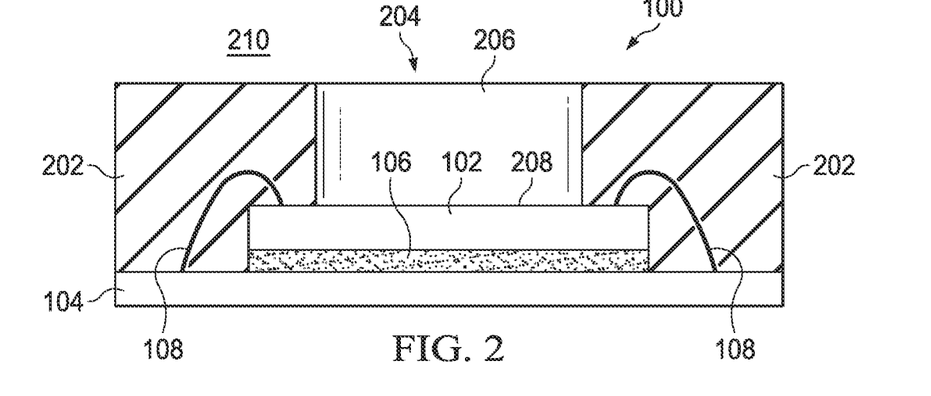
Figure 3:
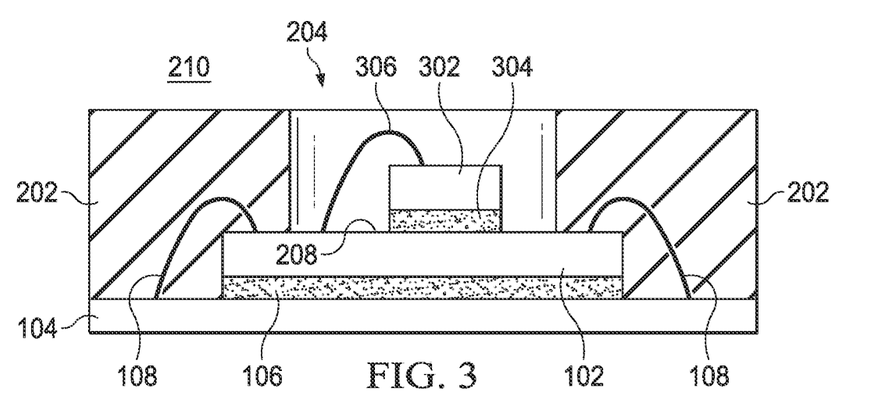

FIGS. 1-4 illustrate example stages in the formation of an example IC package 400 (FIG. 4) constructed in accordance with the teachings disclosed herein. FIG. 1 illustrates a die assembly 100 that includes a semiconductor die 102 that is mounted to an underlying substrate 104. In some examples, the substrate 104 is a leadframe commonly used to support dies. In the illustrated example, the die 102 is a bottom die onto which a second or top die 302 will be mounted as shown in FIG. 3.

In the illustrated example, the die 102 is mounted or affixed to the substrate 104 via a die attach layer 106. The die attach layer 106 is formed using any suitable die attaching technique (e.g., adhesive tape, etc.). After the die 102 is attached to the substrate 104, the die 102 is electrically connected to contacts on the substrate 104 with wire bonds 108. While two wire bonds are shown in the cross-sectional view of the illustrated example, there may be any number of wire bonds formed in any suitable configuration. In other examples, the die 102 may be a flip chip that is physically attached and electrically connected to the substrate 104 via reflow soldering and subsequent underfill processes. In such examples, the wire bonds 108 may be omitted.

FIG. 2 illustrates the die assembly 100 of FIG. 1 enclosed within a housing 202. The housing 202 is formed by applying a molding compound around the die 102 and the wire bonds 108. Once applied onto the die 102, the molding compound undergoes a curing process to solidify and form the final shape of the housing 202. The material used for the housing 202 may be any material that can suitably encapsulate the die 102 without undermining the operation or function of the die 102. The material used for the hosing 202 may be any suitable epoxy molding compound. The particular type and/or formulation of the epoxy molding compound depends on the reliability targets for the resulting package. In the illustrated example, the housing 202 is shown formed on only one side of the substrate 104. In some examples, the housing 202 may be formed on both sides of the substrate 104 to also encapsulate the substrate (except for leads that may stick out of the housing 202 to enable the resulting IC package 400 to be subsequently connected to other components).

Unlike other known IC packages, in the illustrated example of FIG. 2, the housing 202 is formed with a cavity or opening 204 that defines an open path 206 between a surface 208 of the die 102 and an external environment 210 surrounding the housing 202. There are a variety of methods that may be employed to form the cavity 204, which will be described further below in connection with FIGS. 5-10.

Figure 4:
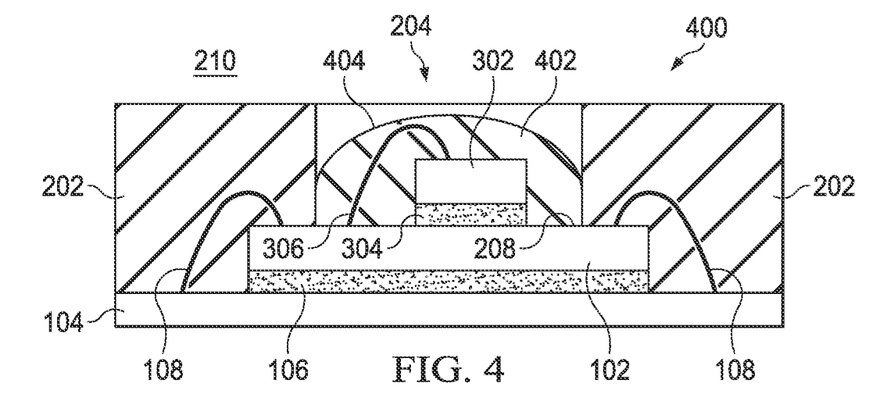

The cavity 204 of the housing 202 provides access to the surface 208 of the bottom die 102 to enable the top die 302 to be mounted thereon as shown in FIG. 3. In the illustrated example, the cavity 204 is represented with shading lines as having a generally circular cross-section. However, the cavity 204 may be of any suitable shape having a size sufficient to enable the top die 302 to be mounted to the bottom die 102. As shown in the illustrated example, the top die 302 is mounted or affixed to the bottom die 102 via another die attach layer 304. The top die 302 may be attached to the bottom die 102 using any suitable die attachment technique. In some examples, the die attach layer 304 may be similar to the die attach layer 106 described above. In other examples, the materials and/or the methods of attachment for the die attach layer 304 may be different than the die attach layer 106. Additionally, the top die 302 is electrically connected to the bottom die 102 via one or more wire bonds 306. In some examples, the wire bonds 306 may be omitted if the top die 302 is a flip chip. After the top die 302 is mounted on the bottom die 102, an encapsulant material 402, different than the material used to form the housing 202 is applied on the top die 302 and the exposed surface 208 of the bottom die 102 as shown in FIG. 4. The encapsulant material 402 may be any material that can suitably encapsulate the top die 302 without significantly undermining its operation or function. For example, where the top die 302 includes a stress-sensitive semiconductor device, the encapsulant material 402 may include a silicone epoxy or adhesive or an epoxy hybrid with a modulus of elasticity that is lower than the modulus of elasticity for the material used to form the housing 202. That is, in such examples, the encapsulant material 402 has a lower modulus of elasticity than the material used for the housing 202. In some examples, the encapsulant material 402 is the same material used in the die attach layer 304 used to mount the top die 302. In this manner, the top die 302 is fully surrounded by an encapsulant that supports the functionality of the top die 302.

As shown in the illustrated example of FIG. 4, an outer surface 404 of the encapsulant material 402 is exposed or open to the external environment 210. In this manner, the encapsulant material 402, with a low modulus of elasticity, is free to move and, thus, absorb stresses experienced by the IC package 400 to protect the stress-sensitive semiconductor device on the top die 302.

In other applications, the top die 302 may include an optical semiconductor device. In such examples, the material used to form the housing 202 may have different light transmission properties than the encapsulant material 402. For instance, in some examples, while the material of the housing 202 is be opaque, the encapsulate material 402 is capable of transmitting light. Thus, for example, the encapsulant material 402 may be a transparent or translucent material such as an optical-quality silicone encapsulant. In this manner, light may still pass through the path 206 between the optical semiconductor device and the external environment 210.

The encapsulant material 402 may be applied through injection molding, dispense molding, and/or in any other suitable manner. Subsequently, the applied material may be treated (e.g., by heating) to set or cure the material to its final form. The amount of the encapsulant material 402 applied over the top die 302 may vary depending upon the application and design specifications for the IC package 400. As shown in the illustrated example of FIG. 4, there is enough encapsulant material 402 to fully encapsulate the top die 302 and completely cover exposed portions of the bottom die 102. In this manner, both the bottom die 102 and the top die 302 are fully encapsulated. However, as shown in the illustrated example, the amount of the encapsulant material 402 is less than the volume of the cavity 204. As a result, the top of the outer surface 404 of the encapsulant material 402 is below a top surface of the housing 202. In other examples, the encapsulant material 402 may substantially fill the cavity 204 and be substantially even with the top surface of the housing 202. In other examples, the encapsulant material 402 may extend beyond the top of the housing 202.

Figure 5:
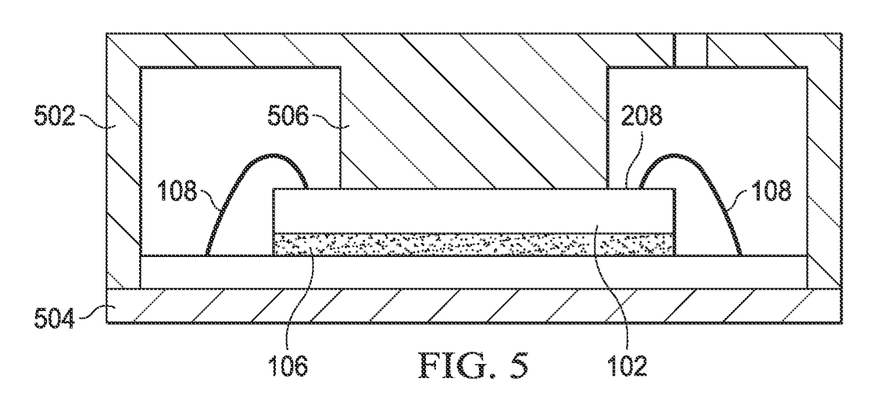
FIGS. 5 and 6 illustrate example stages in the formation of the cavity in the housing of the IC package of FIGS. 1-4.
Figure 6:
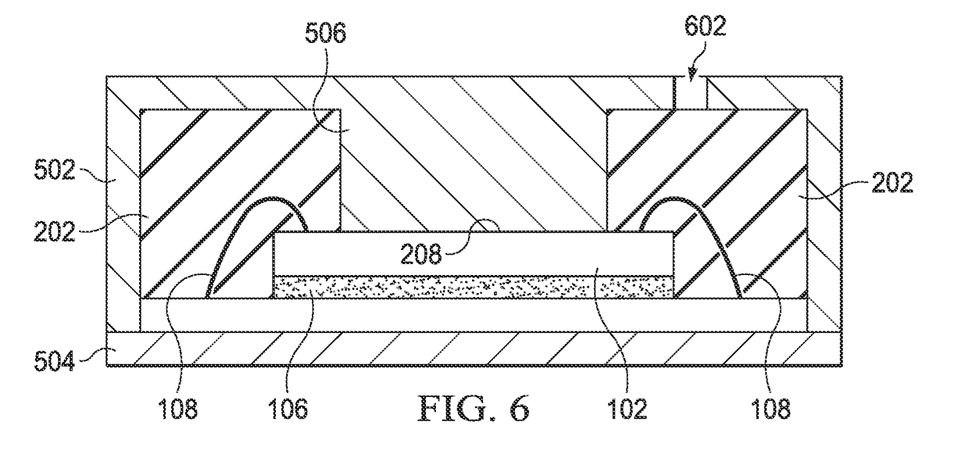

FIGS. 5 and 6 illustrate stages in an example method to form the cavity in the housing of the IC package 400 of FIG. 4. The stages represented in FIGS. 5 and 6 occur between the stages represented in FIGS. 1 and 2. In particular, FIG. 5 illustrates the die assembly 100 of FIG. 1 enclosed within a mold assembly including an upper mold 502 and a lower mold 504. As shown in the illustrated example, the upper mold 502 includes a protrusion or pin 506 that extends to the top surface 208 of the die 102 when the mold assembly is closed around the die assembly 100. As shown in FIG. 6, as the molding compound for the housing 202 is injected into the mold assembly via an injection gate 602, the compound will flow through the open spaces to surround the pin 506 and cover the die 102. That is, in the illustrated example, the pin 506 has a column-like structure positioned within a central region of the mold assembly (above the die 102) with space on all sides of the pin 506 for the compound to flow and fill the entire area within the mold assembly. In some examples, the mold assembly may include additional injection gates (other than the injection gate 602 shown in the illustrated example) to facilitate the delivery of the compound to all open spaces within the assembly. After the mold compound has been added and the upper and lower molds 502, 504 are separated, the space occupied by the pin 506 will correspond to the cavity 204 as shown in FIG. 2.

Figure 7:
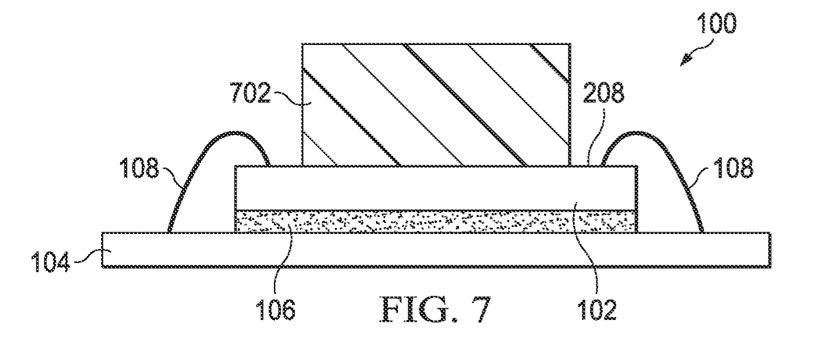
FIGS. 7-10 illustrate different example stages in the formation of the cavity in the housing of the IC package of FIGS. 1-4.
Figure 8:
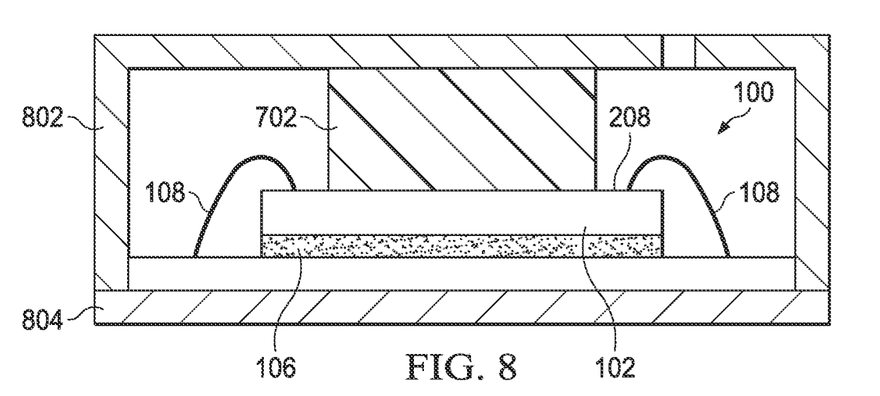
Figure 9:
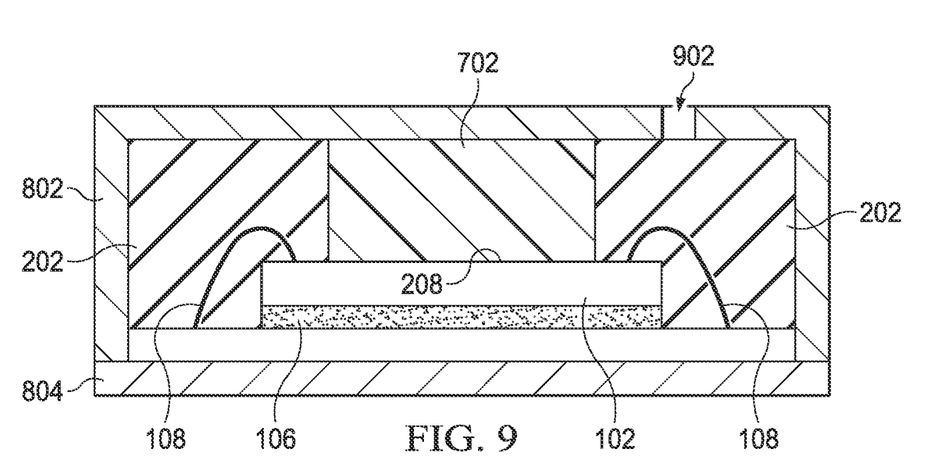
Figure 10:
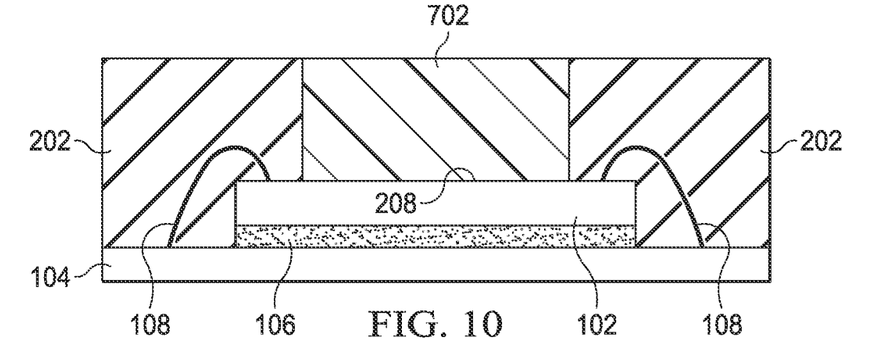

Another example method to form the cavity 204 is illustrated in FIGS. 7-10. More particularly, FIGS. 7-10 illustrate different stages that occur between the stages represented in FIGS. 1 and 2. FIG. 7 shows the die assembly 100 of FIG. 1 with a removable material 702 applied to the surface 208 of the die 102. The removable material 702 is temporarily applied to define a space that will subsequently correspond to the cavity 204 of the housing 202. FIG. 8 illustrates the die assembly 100 with the removable material 702 enclosed within upper and lower molds 802, 804 of a mold assembly. FIG. 9 illustrates the molding compound for the housing 202 injected into the mold assembly via the injection gate 902. In the illustrated example, the removable material 702 is dimensioned to be smaller than the upper mold to prove space around its perimeter for the molding compound to flow to surround the removable material 702 and covers the die 102. In some examples, additional injection gates may be included in the mold assembly to facilitate the delivery of the mold compound. FIG. 10 shows the assembly after the upper and lower molds have been removed. As shown in the illustrated example, the removable material 702 corresponds to the space defined by the cavity 204. Thus, removing the removable material 702 results in the housing 202 with the cavity 204 as shown in FIG. 2. In some examples, the removable material 702 is removed by a picker tool mechanically pulling the removable material 702 from the cavity 204. In other examples, the removable material 702 is removed via vacuum suction. In other examples, the removable material 702 is removed via a wet etch procedure in which a solvent is applied to selectively attack the removable material 702. The removable material 702 may be any suitable material that can withstand the relatively high temperatures (e.g., up to 200° C.) associated with the mold curing procedure and still be removed thereafter with little to no residue. Thus, in some examples, the removable material 702 has a relatively high surface tension, an easily cleaned residue, and is a fiber-free material. For instance, the removable material 702 may be high thermal tape (e.g., Kapton® tape), high thermal ultraviolet (UV) tape, etc.

Figure 11:
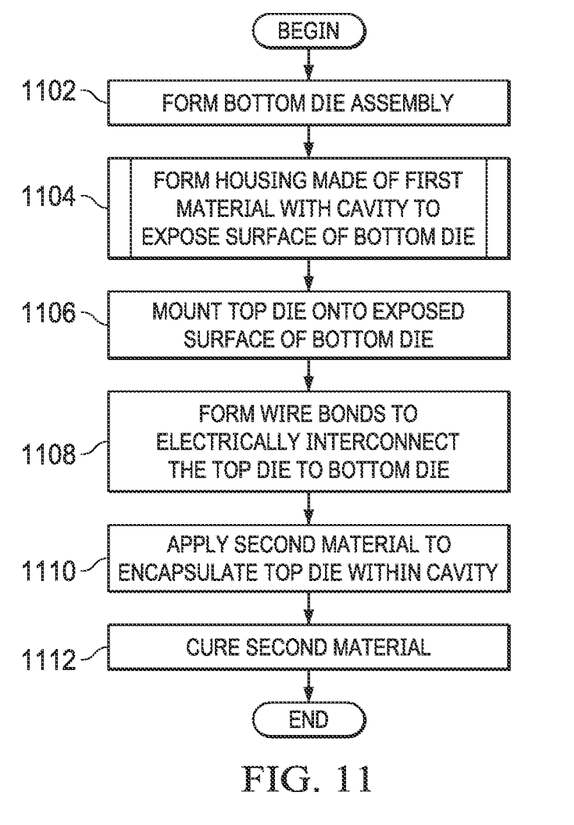
FIG. 11 is a flowchart representative of an example method to manufacture the example IC package of FIGS. 1-4.

FIG. 11 is a flowchart representative of an example method to manufacture the example IC package 400 of FIG. 4. The example process begins at block 1102 by forming a bottom die assembly (e.g., the die assembly 100 of FIG. 1). The formation of the bottom die assembly may be accomplished using any suitable packaging techniques. In particular, a leadframe (e.g., the leadframe 104) is formed and the bottom die (e.g., the bottom die 102) is attached to the leadframe. Thereafter, wire bonds (e.g., the wire bonds 108) are added to electrically connect the bottom die to the leadframe to complete the bottom die assembly. In some examples, where the bottom die is a flip chip, the wire bonding may be omitted. At block 1104, the example process involves forming a housing (e.g., the housing 202) made of a first material with a cavity (e.g., the cavity 204) to expose a surface of the bottom die (e.g., the surface 208 of the bottom die 102). Two different example methods to form the housing with the cavity are described in greater detail below in connection with FIGS. 12 and 13.

At block 1106, the process involves mounting a top die (e.g., the top die 302) onto the exposed surface of the bottom die. The top die may be mounted to the bottom die using any suitable die attachment technique. At block 1108, the example process involves forming wire bonds (e.g., the wire bond 306) to electrically interconnect the top die to the bottom die. In some examples, where the top die is a flip chip, the wire bonding may be omitted. At block 1101, the example process involves applying a second material (e.g., the encapsulant material 402) to encapsulate the top die within the cavity. The second material may be applied using any suitable technique. In some examples, the second material is applied using an injection molding process. In other examples, the second material may be applied through a dispense molding process. At block 1112, the example process involves curing the second material. Thereafter, the example process of FIG. 11 ends.

Figure 12:
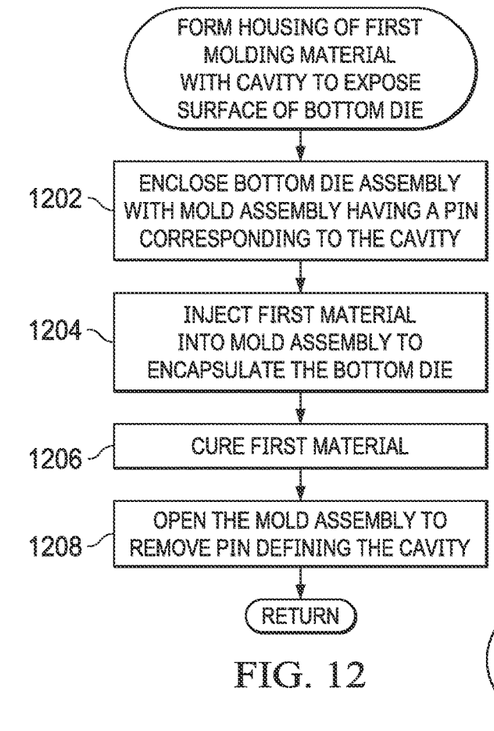
FIG. 12 is a flowchart representative of an example method to form the example housing of the example IC package of FIGS. 1-4 following the process represented by FIGS. 5 and 6.

FIG. 12 is a flowchart representative of an example method to implement block 1104 of FIG. 11 to form the housing made of the first material with a cavity. The example process of FIG. 12 begins at block 1202 by enclosing the bottom die assembly within a mold assembly having a pin (e.g., the pin 506) corresponding to the cavity. The pin is dimensioned to extend to the top surface of the bottom die when the mold assembly is closed to protect a portion of the top surface of the bottom die from being covered by a molding compound to be injected into the mold assembly. The area of the portion of the top surface of the bottom die protected by the pin corresponds to the cross-sectional area of the pin. Thus, in some examples, the pin is dimensioned with a cross-sectional area sufficiently large to define a space on the bottom die onto which a second die (the top die) may be attached and electrically connected (e.g., via wire bonds) to bottom die. At block 1204, the example process involves injecting the first material into the mold assembly to encapsulate the bottom die. In some examples, the first material may be injected into the mold assembly through a single top injection gate. In such examples, the pin is dimensioned sufficiently small to allow passage of the first material around the pin to fill the entire volume within the mold assembly. In other examples, there may be more than one injection gate and the injection gate(s) may be positioned at other locations that the top of the mold assembly. At block 1206, the example process involves curing the first material. At block 1208, the example process opens the mold assembly to remove the pin defining the cavity. That is, as the mold assembly is opened and the pin is removed, the area previously occupied by the pin becomes a cavity within the molded housing that is open to the external environment. More particularly, the base of the cavity corresponds to the portion of the top surface of the bottom die that was protected by the pin during the molding process. Accordingly, the portion of the surface of the bottom die protected by the pin becomes exposed to the external environment and accessible for the top die to be mounted thereon as discussed above at block 1106 of FIG. 11. Accordingly, after the mold assembly is opened to remove the pin (block 1208), the example process of FIG. 12 ends and returns to complete the example process of FIG. 11.

Figure 13:
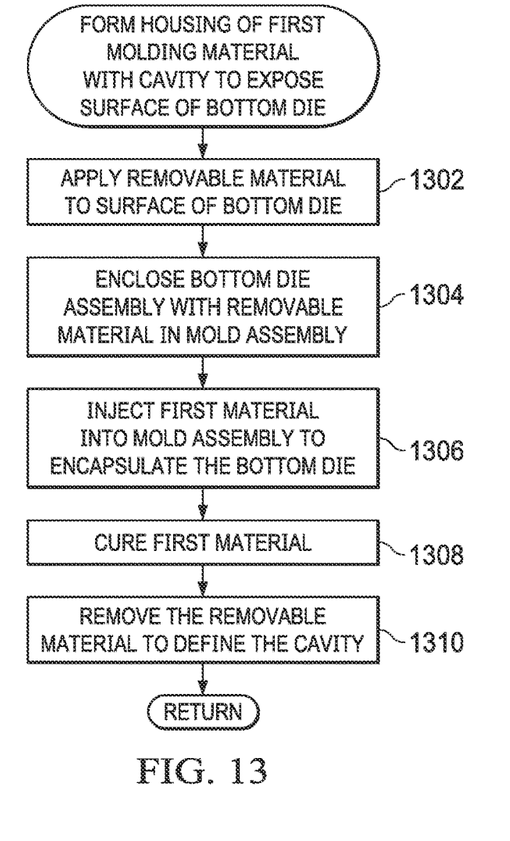
FIG. 13 is a flowchart representative of another example method to form the example housing of the example IC package of FIGS. 1-4 following the process represented by FIGS. 7-10.

FIG. 13 is a flowchart representative of another example method to implement block 1104 of FIG. 11 to form the housing made of the first material with a cavity. The example process of FIG. 13 begins at block 1302 by applying a removable material (e.g., the removable material 702) to the surface of the bottom die. At block 1304, the example process involves enclosing the bottom die assembly with the removable material within a mold assembly. At block 1306, the example process involves injecting the first material into the mold assembly to encapsulate the bottom die. At block 1308, the example process involves curing the first material. At block 1310, the example process involves removing the removable material to define the cavity. Thereafter the example process of FIG. 13 ends and returns to complete the example process of FIG. 11.

Although example methods are described with reference to the flowcharts illustrated in FIG. 11-13, many other methods of manufacturing the example IC package 400 of FIG. 4 may alternatively be used in accordance with the teachings disclosed herein. For example, the order of execution of the blocks may be changed, and/or some of the blocks described may be changed, eliminated, or combined. Similarly, additional operations may be included in the manufacturing process before, in between, or after the blocks shown in the illustrated examples.

Figure 14:
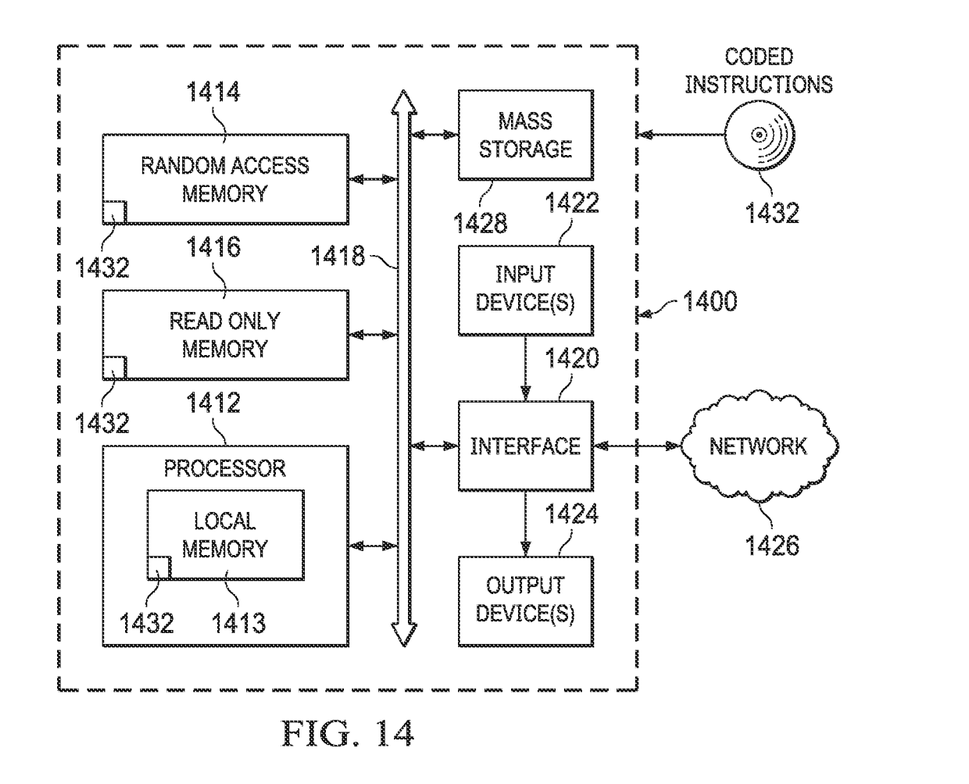
FIG. 14 is a block diagram of an example processor system associated with one or more IC packaging machines to execute example machine readable instructions represented at least in part by the example methods of FIG. 11-13 to manufacture the example IC package of FIGS. 1-10.

FIG. 14 is a block diagram of an example processor system associated with one or more IC packaging machines to execute example machine readable instructions represented at least in part by the example methods of FIG. 11-13 to manufacture the example IC package of FIGS. 1-10. The processor platform 1400 can be any other type of computing device.

The processor platform 1400 of the illustrated example includes a processor 1412. The processor 1412 of the illustrated example is hardware. For example, the processor 1412 can be implemented by one or more integrated circuits, logic circuits, microprocessors or controllers from any desired family or manufacturer. The hardware processor may be a semiconductor based (e.g., silicon based) device.

The processor 1412 of the illustrated example includes a local memory 1413 (e.g., a cache). The processor 1412 of the illustrated example is in communication with a main memory including a volatile memory 1414 and a non-volatile memory 1416 via a bus 1418. The volatile memory 1414 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1416 may be implemented by flash memory and/or any other desired type of memory device. Access to the main memory 1414, 1416 is controlled by a memory controller.

The processor platform 1400 of the illustrated example also includes an interface circuit 1420. The interface circuit 1420 may be implemented by any type of interface standard, such as an Ethernet interface, a universal serial bus (USB), and/or a PCI express interface.

In the illustrated example, one or more input devices 1422 are connected to the interface circuit 1420. The input device(s) 1422 permit(s) a user to enter data and/or commands into the processor 1412. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1424 are also connected to the interface circuit 1420 of the illustrated example. The output devices 1424 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1420 of the illustrated example, thus, typically includes a graphics driver card, a graphics driver chip and/or a graphics driver processor.

The interface circuit 1420 of the illustrated example also includes a communication device such as a transmitter, a receiver, a transceiver, a modem and/or network interface card to facilitate exchange of data with external machines (e.g., computing devices of any kind) via a network 1426 (e.g., an Ethernet connection, a digital subscriber line (DSL), a telephone line, coaxial cable, a cellular telephone system, etc.).

The processor platform 1400 of the illustrated example also includes one or more mass storage devices 1428 for storing software and/or data. Examples of such mass storage devices 1428 include floppy disk drives, hard drive disks, compact disk drives, Blu-ray disk drives, RAID systems, and digital versatile disk (DVD) drives.

Coded instructions 1432 to implement the example methods of FIGS. 11-13 may be stored in the mass storage device 1428, in the volatile memory 1414, in the non-volatile memory 1416, and/or on a removable tangible computer readable storage medium such as a CD or DVD.

From the foregoing, it will be appreciated that example methods, apparatus and articles of manufacture have been disclosed that that enable the independent encapsulation of vertically stacked semiconductor dies. As a result, different materials suited for each die may be used in the encapsulation process. This is made possible by attached an upper die in the stack after applying the encapsulant to a lower die. Access to the surface of the lower die to enable the attachment of the upper die is achieved by forming a cavity or opening in the encapsulant applied to the lower die. Once the upper die is attached and electrically connected, a second encapsulant material is applied within the cavity to cover the upper die and any exposed portions of the lower die to fully encapsulate the vertically stacked dies.

Example 1 is an apparatus that includes a semiconductor die and a housing enclosing the semiconductor die. The housing defines a cavity to expose at least a portion of the semiconductor die to an external environment. The housing is formed of a first material. The apparatus further includes a second material disposed within the cavity to block exposure of the semiconductor die to the external environment.

Example 2 includes the subject matter of Example 1, wherein the semiconductor die is a first semiconductor die. The apparatus further includes a second semiconductor die mounted to the portion of the first semiconductor die. The second material encapsulates the second semiconductor die.

Example 3 includes the subject matter of Example 2, wherein the first material has a first modulus of elasticity and the second material has a second modulus of elasticity. The first modulus of elasticity is greater than the second modulus of elasticity.

Example 4 includes the subject matter of Example 3, wherein the second semiconductor die includes a stress-sensitive semiconductor device.

Example 5 includes the subject matter of Example 2, wherein the second material is at least one of transparent or translucent.

Example 6 includes the subject matter of Example 5, wherein the second semiconductor die includes an optical semiconductor device.

Example 7 includes the subject matter of Example 2, wherein the second semiconductor die is wire bonded to the portion of the first semiconductor die.

Example 8 includes the subject matter of Example 1, wherein the semiconductor die is mounted to a leadframe within the housing.

Example 9 is an integrated circuit packaging that includes a die and a molded housing enclosing the die. The housing has an opening that defines a path from a surface of the die to an external environment, the housing formed of a first material. The integrated circuit packaging also includes a second material disposed within the opening to block exposure of the die to the external environment via the path.

Example 10 includes the subject matter of Example 9, wherein the die is a first die. The integrated circuit packaging further including a second die mounted to the surface of the first die. The second material encapsulates the second die.

Example 11 includes the subject matter of Example 10, wherein the second die includes a stress-sensitive semiconductor device.

Example 12 includes the subject matter of Example 11, wherein the first material has a first modulus of elasticity and the second material has a second modulus of elasticity. The first modulus of elasticity is greater than the second modulus of elasticity.

Example 13 includes the subject matter of Example 10, wherein the second die corresponds to an optical semiconductor device.

Example 14 includes the subject matter of Example 13, wherein the second material is at least one of transparent or translucent.

Example 15 is a method that includes forming an opening in a housing enclosing a die. The opening exposing a surface of the die to an external environment. The housing being formed of a first material. The method further includes applying a second material within the opening to isolate the surface of the die from the external environment.

Example 16 includes the subject matter of Example 15, and further includes forming the opening in the housing by: enclosing the die in a mold assembly, the mold assembly including a pin to define the opening; injecting the first material into the mold assembly and around the pin; and removing the mold assembly.

Example 17 includes the subject matter of Example 15, and further includes forming the opening in the housing by: applying a removable material to the surface of the die; molding the first material around the die and the removable material; and removing the removable material.

Example 18 includes the subject matter of Example 15, wherein the die is a first die. The method further includes: mounting a second die to the surface of the first die; and applying the second material after mounting the second die. The second material encapsulates the second die.

Example 19 includes the subject matter of Example 18, wherein the second die includes a stress-sensitive semiconductor device. The second material has a modulus of elasticity that is lower than the first material so that stress on the second die is less than stress on the first die.

Example 20 includes the subject matter of Example 18, wherein the second die corresponds to an optical semiconductor device. The second material is at least one of transparent or translucent to enable light to pass between the second die and the external environment.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus, comprising:
   a first semiconductor die;
   a housing enclosing portions of the first semiconductor die, the housing defining an opening, including a vertical sidewall, the vertical sidewall physically contacting and extending from a surface of the first semiconductor die to a plane along a top surface of the housing, the housing formed of a first material;
   a second material that is transparent or translucent, disposed within the opening; and
   a second semiconductor die including an optical semiconductor device attached to the first semiconductor die, the second material covering portions of the second semiconductor die.

2. The apparatus of claim 1, wherein the vertical sidewall physically contacting and extending from the surface of the first semiconductor die includes an end of the vertical sidewall physically contacting a top surface of the first semiconductor die.

3. The apparatus of claim 1, wherein the first material has a first modulus of elasticity and the second material has a second modulus of elasticity, the first modulus of elasticity being greater than the second modulus of elasticity.

4. The apparatus of claim 1, wherein the second semiconductor die is wire bonded to the portion of the first semiconductor die.

5. The apparatus of claim 1, wherein the first semiconductor die is mounted to a leadframe within the housing.

6. The apparatus of claim 1, wherein a surface of the second material includes a convex shape with respect to a top surface of the first semiconductor die.

7. An integrated circuit package, comprising:
a substrate;
a first die attached to and electrically connected to the substrate;
a second die including an optical semiconductor device attached to and electrically connected to the first die;
a first material covering portions of the first die, wherein the first material includes a vertical sidewall physically contacting and extending from a top surface of the first die to a plane along a top surface of the first material; and
a second material covering portions of the second die and portions of a surface of the first die, the second material within a cavity of the first material, wherein the second material is transparent or translucent.

8. The integrated circuit package of claim 7, wherein a portion of the cavity defining an end of the cavity directly contacts a top surface of the first die, and wherein the end of the cavity is at one end of the vertical sidewall.

9. The integrated circuit package of claim 7, wherein the first material has different light transmission properties than the second material.

10. The integrated circuit package of claim 7, wherein the second die includes a stress-sensitive semiconductor device.

11. The integrated circuit package of claim 7, wherein the first material has a first modulus of elasticity and the second material has a second modulus of elasticity, the first modulus of elasticity being greater than the second modulus of elasticity.

12. The integrated circuit package of claim 7, wherein a top surface of the second material includes a convex shape with respect to a top surface of the substrate.

13. An apparatus, comprising:
a first semiconductor die;
a housing enclosing portions of the semiconductor die, the housing defining an opening that extends from a surface of the first semiconductor die to a plane along a top most surface of the housing, the housing formed of a first material, wherein a sidewall of the opening that extends from the surface of the first semiconductor die to the plane along the top most surface of the housing lies in a single plane;
a second semiconductor die mounted on the first semiconductor die; and
a second material disposed within the opening and covering portions of the second semiconductor die and a bond wire connected between then first semiconductor die and the second semiconductor die, wherein the second material is transparent or translucent, and wherein a portion of the housing defining an end of the opening directly, and without any intervening components, contacts a top surface of the first semiconductor die.

14. The apparatus of claim 13, wherein the first material has a first modulus of elasticity and the second material has a second modulus of elasticity, the first modulus of elasticity being greater than the second modulus of elasticity.

15. The apparatus of claim 13, wherein the second semiconductor die includes a stress-sensitive semiconductor device.

16. The apparatus of claim 13, wherein a surface of the second material includes a convex shape with respect to a top surface of the first semiconductor die.

* * * * *